US008299556B2

(12) United States Patent
Fertig et al.

(10) Patent No.: US 8,299,556 B2
(45) Date of Patent: Oct. 30, 2012

(54) USING 3D INTEGRATED DIFFRACTIVE GRATINGS IN SOLAR CELLS

(75) Inventors: Matthias Fertig, Böblingen (DE); Thomas Pflueger, Böblingen (DE); Thomas Morf, Rueschlikon (CH); Nikolaj Moll, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 483 days.

(21) Appl. No.: 12/632,129

(22) Filed: Dec. 7, 2009

(65) Prior Publication Data

US 2010/0101638 A1    Apr. 29, 2010

(30) Foreign Application Priority Data

Jan. 14, 2008 (EP) .................................. 08100427
Jan. 7, 2009 (EP) ................................ 2009/050094

(51) Int. Cl.
*H01L 31/0232* (2006.01)
*H01L 31/00* (2006.01)
*H01L 21/00* (2006.01)

(52) U.S. Cl. ................. 257/432; 257/E31.127; 438/69; 136/255

(58) Field of Classification Search .................... 438/69; 257/432, E31.127; 136/255
See application file for complete search history.

(56) References Cited

U.S. PATENT DOCUMENTS

| | | | | |
|---|---|---|---|---|
| 5,151,818 | A * | 9/1992 | Thijs et al. ..................... | 359/344 |
| 6,891,869 | B2 * | 5/2005 | Augusto .................... | 372/43.01 |
| 2002/0000244 | A1 | 1/2002 | Zaidi | |
| 2005/0212045 | A1 | 9/2005 | Tamai | |
| 2006/0011954 | A1 | 1/2006 | Ueda et al. | |
| 2007/0041679 | A1 | 2/2007 | Huang | |
| 2007/0230534 | A1 * | 10/2007 | Erlandson et al. ............ | 372/102 |

FOREIGN PATENT DOCUMENTS

| | | |
|---|---|---|
| JP | 58-103180 | 6/1983 |
| JP | 61-163592 | 7/1986 |
| JP | 06-090016 | 3/1994 |
| JP | 2003-502847 | 1/2003 |
| WO | WO 99/19912 | 4/1999 |
| WO | WO 00/77861 | 12/2000 |

OTHER PUBLICATIONS

International Search Report and written opinion Nov. 27, 2009.

* cited by examiner

*Primary Examiner* — Matthew Landau
*Assistant Examiner* — Khaja Ahmad
(74) *Attorney, Agent, or Firm* — Yuanmin Cai

(57) ABSTRACT

A multi-junction opto-electronic device including a stack of wavelength selective absorption layers is proposed. The absorption layers include each a first layer with a grating of a specific pitch defining the wavelength of the incident light to be absorbed within a subjacent second electrically active layer itself on a third electrically inactive layer. The second electrically active layer within the different absorption layers is in electrical connection with lateral contacts to extract the electrical charge carriers generated by the absorbed incident light within the active layer. The grating within the first layer of the absorption layers is defined by periodic stripes of specific width depending on the wavelength to be absorbed by the respective absorption layers. The period of the stripes alignment is defined by the pitch of the grating. Advantageously, ordinary silicon technology can be used.

9 Claims, 6 Drawing Sheets

US 8,299,556 B2

USING 3D INTEGRATED DIFFRACTIVE GRATINGS IN SOLAR CELLS

CROSS-REFERENCE TO RELATED APPLICATIONS

The present application claims priority of a PCT Patent Application EP2009/050094 filed Jan. 7, 2009 with the European Patent Office, which in turn claims priority of a European Patent Application No. 08100427.7 filed Jan. 14, 2008, the content of which are incorporated herein by reference in their entireties.

FIELD OF THE INVENTION

The present invention relates to an integrated circuit having one or more of multi-junction opto-electronic devices. More specifically, it relates a multi-junction opto-electronic device having a stack of wavelength selective absorption layers. It is also related to a manufacturing method for such multi-junction opto-electronic device.

BACKGROUND OF THE INVENTION

The usage of the photo-electric effect in solar cells to generate energy is one of the most promising approaches to satisfy the demand on energy in a "green" fashion. Since the existing world record for the efficiency of solar cells is about 38% but for very costly chip, an improvement is highly demanded especially to lower the manufacturing cost. And the area of research for solar cells is closed to the one concerning opto-electronic devices used for detecting light for the purpose of optical communication. The semiconductor in conventional solar cells performs two processes simultaneously to produce a photovoltaic effect; absorption of light, and the separation of electric charges (electrons and positively charged species called "holes"). Semiconductors absorb photons having higher energy than the bandgap by exciting an electron from the valence band to the conduction band, leaving behind a positively charged hole. If these excited state charge carriers can be separated before they spontaneously recombine, voltage and current can be derived that can provide power to a load. However, several energy loss mechanisms complicate and limit the energy production potential. First, light energy that is lower than the semiconductor bandgap simply passes through unutilized, which represents a significant loss. Second, when an electron is excited to the conduction band by a photon with energy greater than the bandgap, it will lose energy as heat (thermalization of photogenerated carriers) until the energy of the electron is reduced to the bandgap energy. This loss of energy is referred to as 'overexcitation energy'. Finally, an electron in its excited state will spontaneously return to its ground state, and in doing so will release energy as heat or light. This is known as recombination of the photoexcited electron-hole pairs. Together, these losses limit silicon semiconductors to a maximum achievable efficiency of 33% or in specific cases up to 38%. Conventional single junction silicon solar cells today exhibit efficiencies between 11-18% as a result of light loss due to reflection from the front surface of the cell, shadowing by the electrical contacts, and ohmic losses at the semiconductor/electrode junctions.

The energy of photons decreases at higher wavelengths. The highest wavelength when the energy of photon is still big enough to produce free electrons is 1.15 µm when silicon material is used. Radiation with higher wavelength causes only heating up of solar cell and does not produce any electrical current. So even at lower wavelengths many photons do not produce any electron-hole pairs, yet they effect on increasing solar cell temperature.

The cost of silicon-based technologies lies largely in materials. Because silicon is a relatively poor absorber of light, the cells are quite thick (~200-400 µm), and therefore use large amounts of high-quality silicon. The usage of thin-film solar cells may reduce the material cost possibly up to ⅛₀th of conventional solar cells. Since individual cells are made by cutting through silicon crystals or ingots, additional material losses (known as kerf losses) are associated with sawing. Batch processing to create interconnections, combined with high material and manufacturing facility costs, further add to the fixed costs. Given the low light absorption and high material costs associated with traditional solar technology, thin films emerged in the 1970s as a potential solution, using less silicon (amorphous silicon) or entirely new semiconductor materials, such as cadmium telluride (CdTe), copper indium gallium diselenide (CIGS), or cadmium sulfide (CdS), together with transparent conducting oxides. Higher efficiency triple junction cells comprising InGaP/InGaAs/Ge for space applications have achieved 28% efficiency. However, these new semiconductors require vacuum deposition, which makes manufacturing scale-up costly. Thus, despite the reduction in raw material costs, all of the thin film technologies remain complex and expensive. For this reason, the thin film solar cell technologies have taken at over twenty years to transition from the status of promising research (about 8% efficiency) to low volume manufacturing facilities.

Nowadays, optical technology is focusing on photonic integrated circuits on a chip. Optical IOs or optical chip-to-chip communication directly onto the chip is restricted today by the fact that the realization of optical detectors in complementary metal oxide semiconductor (CMOS) integrated circuits (IC) is very challenging. Several approaches are found in the literature to integrate optical detectors into commercial IC process. They range from on chip photo diodes implemented with PN (positive-negative) junction available in the process over deep trench memory cells used as detector to hybrid implementations where additional semiconductor layers e.g. Germanium is placed on top of the chip.

Silicon is a useable semiconductor only for very short wavelength detectors. A CMOS process or even better a BIC-MOS process offers a whole range of PN-junction which can be used as detectors. The depletion zones that are generated by PN-junctions are a prerequisite for the generation of solar current. The larger the depletion zone, the larger the sensitive area of a detector and the more charge-hole pairs will be generated by incident light. The usage of lightly doped silicon (the intrinsic area) causes a larger depletion area as for heavily doped silicon. This depletion zone can be further influenced by an externally applied voltage to the PC-contact or a preloading of the P- and N-contact. The PC-contact is also used to prevent a loading of the diffractive grating and thus avoids a reduction of the grating efficiency. This makes an optimization for a vertical standing wave possible. Degenerated grating efficiencies would cause moving maxima of intensity of the standing wave.

Generally, strained silicon techniques like "dual stress liner" or "embedded silicon germanium" are used to improve the switching characteristic of P-MOS and N-MOS transistors (p- or n-type metal oxide semiconductor transistor) by introducing tensile or compressive stress on the atomic structure. For opto-electronic devices the usage of strained silicon would reduce the bandgap by tensile strain that enlarges the atomic distance. This causes an increased sensitivity of the material for wavelengths that are not suitable for silicon detectors without a strain. This increases the absorption of the material. Strained Silicon is available for standard SOI technologies and hence no process modifications are required.

In U.S. Pat. No. 6,891,869 is described a device comprising a number of different wavelength selective active-layers arranged in a vertical stack, having band-alignment and work-function engineered lateral contacts to said active-layers, consisting of a contact-insulator and a conductor-insulator. Photons of different energies are selectively absorbed in or emitted by the active-layers. Contact means are arranged separately on the lateral sides of each layer or set of layers having the same parameters for extracting charge carriers generated in the photon-absorbing layers and/or injecting charge carriers into the photon-emitting layers. The required layers are comparably thick being not optimized for thin-film layers. And the device does not use any facility to concentrate energy of light and does not use any resonant structure.

In US2007/0041679 is described an integrated optical signal wavelength demultiplexing device which may simultaneously demultiplex and detect an optical signal. The integrated device features a waveguide structure to carry an optical signal, a photo-detector in close proximity to the waveguide structure, and a wavelength limiting grating structure integrated with the photo-detector. The grating structure is fabricated within the photo-detector and is used to transmit only a selected wavelength onto the photo-detector.

SUMMARY OF THE INVENTION

In view of the above, it is an object of the present invention to develop an opto-electronic device which is based on standard process used for the manufacturing of integrated circuits while optimizing its efficiency and lowering its cost.

This object is achieved in accordance with the invention by a multi-junction opto-electronic device comprising a stack of wavelength selective absorption layers. The absorption layers comprise each a first layer with a grating of a specific pitch defining the wavelength of the incident light to be absorbed within a subjacent second electrically active layer itself on a third electrically inactive layer. The second electrically active layer within the different absorption layers is in electrical connection with lateral contacts to extract the electrical charge carriers generated by the absorbed incident light within the active layer.

A first embodiment of the multi-junction opto-electronic device according to the invention is characterized in that the grating within the first layer of the absorption layers is defined by periodic stripes of specific width depending on the wavelength to be absorbed by the respective absorption layers. The period of the stripes alignment is defined by the pitch of the grating.

In an embodiment according to the invention, the active layer within the absorption layers is defined by regions doped at variable concentrations such that the region underneath the stripes correspond to a first region doped at a concentration at least an order of magnitude smaller that the concentration of the second regions in between the first regions. The stripes of the first layer are electrically isolated from the first region of the second electrically active layer usually by some glass-like material. The dopants for the first region can be of p- or n-kind whereas being the same for the whole active layer. And the dopants for the second region within the active layer are chosen to be alternately of p- and n-kind. Possibly but not necessarily, the gratings within the first layer of the different absorption layers are covered by an anti-reflective coating. And some electrically inactive filling material can be deposit within the first layer of the absorption layers for equalizing the first layer. This is usually done by covering the gratings possibly but not necessarily already covered itself by the anti-reflective coating.

In an alternative embodiment according to the invention, the absorption layers are covered by an electrically inactive distance layer of a specific width adapted for the generation of stationary waves in the perpendicular direction to the plane comprising the absorption layers. Those stationary waves are coming from a superposition of incident light waves possibly but not necessarily combined with reflected light waves.

In an advantageous alternative according to the invention, the multi-junction opto-electronic device is based on silicon technology such that the electrically inactive layers are made with some glass like material possibly but not necessarily silicon oxide ($SiO_2$). The stripes are then made with poly-silicon and the second electrically active layer is made of silicon accordingly doped. The anti-reflective coating can be made of SiNi. In some embodiment, the grating within the first layer of the absorption layer is made with some material causing tensile strain on the electrically active second layer adjacent to the grating.

In another alternative embodiment according to the invention, the grating is defined by periodic poly-stripes with a period (named a) equal to the pitch of the grating. The poly-stripes themselves are defined by a width varied periodically along their length with a second period (named b). Both period parameters (a and b) are optimized to maximize the absorption of both polarization S and P from the incident light. An advantageous proposed design is optimized for the usage of ultra-thin film solar cells using evanescent coupling into the electrically active silicon absorption layer. Each layer is designed to interact with a certain wavelength, comprising a grating filter that is optimized to provide evanescent coupling into the ultra thin (~100 nm), electrically active layer, comprising depletion zones.

The invention further relates to an integrated circuit comprising one or more multi-junction opto-electronic devices as described above. The invention is also related to a manufacturing method for multi-junction opto-electronic device comprising the step to manufacture a wavelength selective absorption layer as above and then to stack several of such absorption layers with different pitch to absorb correspondingly different wavelengths of the incident light.

Advantageous developments of the invention are described in the claims, the following description and the drawings.

BRIEF DESCRIPTION OF THE DRAWINGS

Embodiments of the invention will be understood and appreciated more fully in the below detailed description with the reference to the attached drawings in which.

Following is a list of reference numbers being used in the above drawings:
- 1 wavelength selective absorption layer;
- 2 3d-metal interconnection;
- 3 3a; 3b metal contact;
- 4 first layer;
- 5 grating;
- 6 anti-reflective coating;
- 7 second active layer;
- 8 depletion area;
- 9 third electrically inactive layer;
- 10 electrically inactive filling material;
- 11 electrically inactive distance layer;
- 12 single layer of 11;
- 13 second region highly doped in between the first region 8;
- 14 thin layer;
- 15 poly-stripes

DETAILED DESCRIPTION OF PREFERRED EMBODIMENTS

Figure 1:
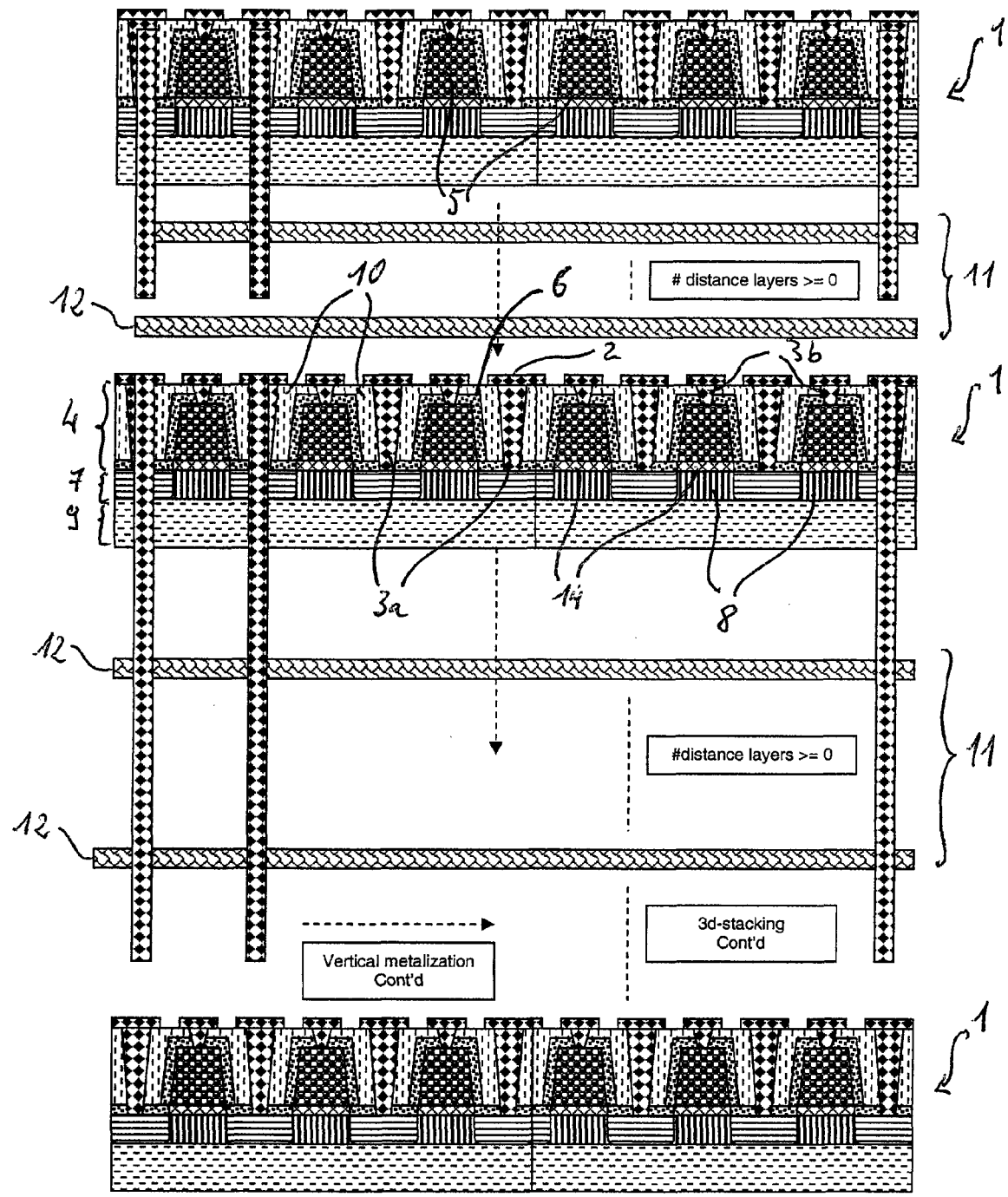
FIG. 1 is a schematic cross-sectional view along the depth of a stack of wavelength selective absorption layers according to the invention.

On FIG. 1 is described a cross-sectional view of a stack of wavelength selective absorption layers 1 according to the invention. The cross-section is taken along the growth axis of the stack almost at its border to show at least partly the lateral electrical contacts. The lateral contacts are placed at the top of each wavelength selective absorption layers 1 and are made out of 3d-metal interconnections 2 electrically connected to metal contacts 3a with an inverted trapezoid like shape such to extract electrical charge carriers generated by absorbed incident light.

Figure 2A:
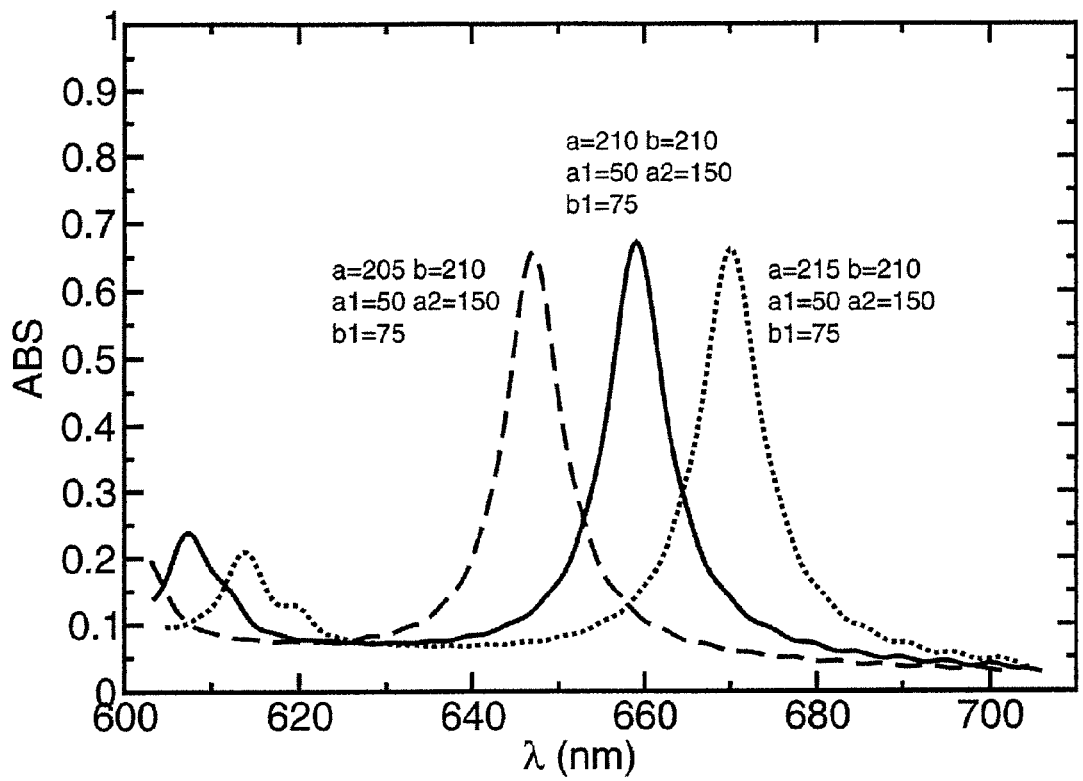
FIG. 2a shows absorption curves of different wavelength lights for gratings of different pitches and widths.
Figure 2B:
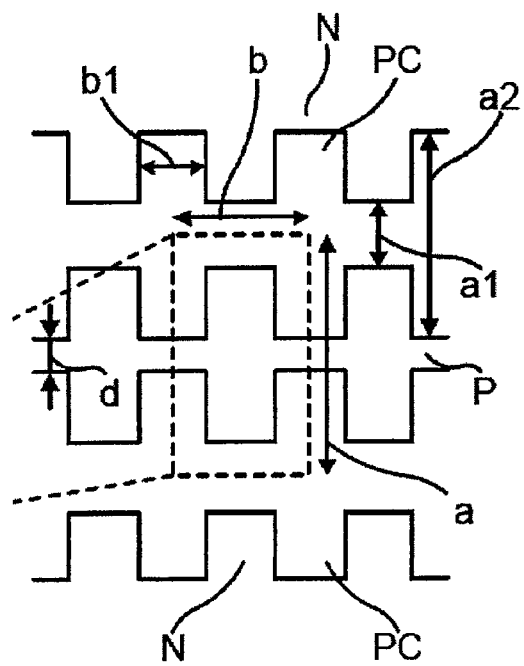
FIG. 2b is a schematic top view of the two dimensional grating made out of poly-stripes.

Each wavelength selective absorption layers 1 is accordingly made out of a first layer 4 with a grating 5 whose pitch defines the wavelength of the incident light to be absorbed by that absorption layer 1. Advantageously, the pitch from the gratings of the different absorption layers 1 stacked together as shown on FIG. 1 are chosen at different values such to cover in an optimized way the wavelength spectrum of interest of the incident light. The choice of the pitches is defined accordingly depending on the material used and the number of wavelength selective absorption layers 1 stacked together. On FIG. 2a are shown different absorption curves for incident light and different pitches (named a and b for the possible embodiment based on a two dimensional diffractive grating made out of poly-stripes) as well as different widths of the two dimensional gratings (named a1, a2 and b1 as shown in FIG. 2b). The choice of the pitches and the widths is taken according to the incident wavelength to be absorbed. Generally, a second order diffractive grating is not a required preliminary, but matches the number of intensity maxima and the minimum feature size of the given process. By that, a maximum of depletion zones can be feed by intensity maxima. An optimized design has a maximum intensity at each depletion zone.

The gratings 5 on each wavelength selective absorption layer 1 as shown on FIG. 1 are covered by some anti-reflective coating 6 to avoid that to much incident light is reflected on the surface of the grating and do not contribute to the generation of electrical charge carriers. It could be conceivable to provide only the first or some of the first top gratings from the stack with such anti-reflective coating 6 since the incident light reflected from wavelength selective absorption layers deep in the stack would at least partly contribute to generation of electrical charge carriers within absorption layers laying above. Also some ground contacts 3b protruding the anti-reflective coating 6 are electrically connected to the gratings to guarantee that no electrostatic phenomenon possibly due to incident radiation take place.

To equalize the top of each wavelength selective absorption layer is deposit above the grating 5 within the first layer 4 an electrically inactive filling material 10. The grating 5 of each absorption layer 1 is itself subjacent to a second layer 7 being electrically active. This is strictly speaking the layer where incident light usually sun light for a solar cell is absorbed. Each grating 5 with their specific pitch acts on a respective wavelength of the spectrum of the incident light as a diffractive filter such that the light at the corresponding wavelength is concentrated within the second layer just underneath the border of the gratings. This regions correspond approximately to the limit of the depletion area 8 localized within the active second layer 7 under the grating 5. Such depletion or first region is obtained by being doped at a concentration at least an order of magnitude smaller than the concentration of the second regions in between the first regions. The active layer 7 is possibly but not necessarily lay down on a third electrically inactive layer 9. Just underneath the grating 5 and above the second active layer 7 is placed some electrically inactive layer 14.

FIG. 1 shows that between the different wavelength selective absorption layers 1 can be placed some electrically inactive distance layer 11 of specific width. The different widths can be obtained by choosing a different number of layers building up that distance layer 11 depending on the stationary waves generated in the perpendicular direction to the plane comprising the absorption layers. Those stationary waves are coming from a superposition of incident light waves possibly combined with light waves reflected at some of the layers from the stack. The width of a single layer 12 of that distance layer 11 is given by the material and the manufacturing process used.

The stacking of the different wavelength selective absorption layers 1 can be obtained in different way using existing manufacturing processing. Usually, the distance layer will be made out of some glass like material i.e. made out of silicon oxide ($SiO_2$). Therefore, a tempering (heat processing) of the stack will achieve to glue all the absorption layers 1 to a stack.

Figure 3:
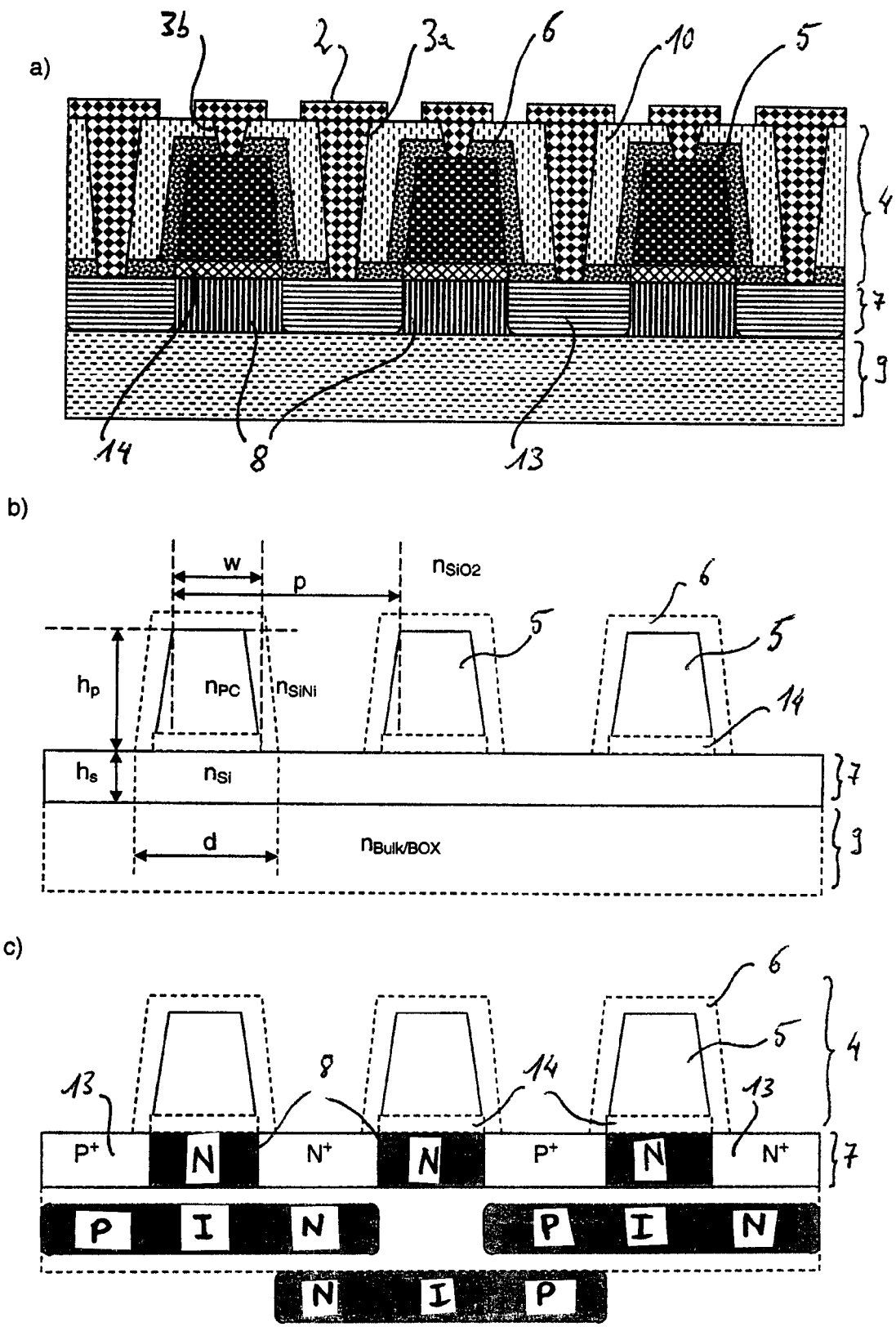
FIGS. 3a-3c is a schematic cross-sectional view of several stripes according to the invention.

Generally, the choice of the material for the gratings may depend on the cost factor and could possibly be based on silicon technology. In that case, all the electrically inactive layers i.e. the filling material 10 within the first layer 4, the electrical isolation 14, the third electrically inactive layer 9 and the electrically inactive distance layer 11 are made out of silicon oxide. The grating itself 5 can be made out of poly-silicon (PC) while the anti-reflective coating 6 could be made out of SiNi (see FIG. 3a). But other material can be chosen within the scope of the present invention. The second active layer 7 is made out of silicon accordingly doped. Independently of the chosen dopants material, the first region corresponding to the depletion area 8 can be of p- or n-kind but is the same for the whole second active layer 7 as shown on FIG. 3c. The dopants for the second region 13 in between the first region 8 are alternately of p- and n-kind. FIGS. 3a and 3b show a schematic cross-sectional view of the grating 5 with the second active layer 7 and the underneath third electrically inactive layer 9. Directly under the grating 5 within the active layer 7 are the regions poorly doped or of p- or n-kind and corresponding to the depletion area 8. In between are the heavily doped regions 13 alternately of p- or n-kind i.e. p+ or n+ (see FIG. 3c).

FIG. 3b shows a detailed cross-sectional view of the grating 5. The grating 5 with a pitch p consists of longitudinal stripes of width w and height hp while the top of the stripes is slightly smaller then the bottom being in close vicinity to the second active layer 7 so to build stripes with trapezoid like cross-sections due to manufacturing conditions. The stripes are electrically isolated from the second active layer 7 by some inactive thin layer 14 possibly made out of silicon oxide. The depletion area 8 within the second active layer 7 is defined by a depletion width d slightly bigger than the width w of the stripes 14 and by a channel height hs corresponding approximately to the thickness of the second active layer 7. Not only the pitch p but possibly also the width w and the height hp of the grating may be optimized to diffract a maximum of incident light at some specific wavelength within the subjacent second active layer 7. It is of advantage if the depletion area is as large as possible so to absorb a maximum of light generating accordingly a maximum of electrical charge carriers to be extracted by the electrical contacts.

Figure 4:
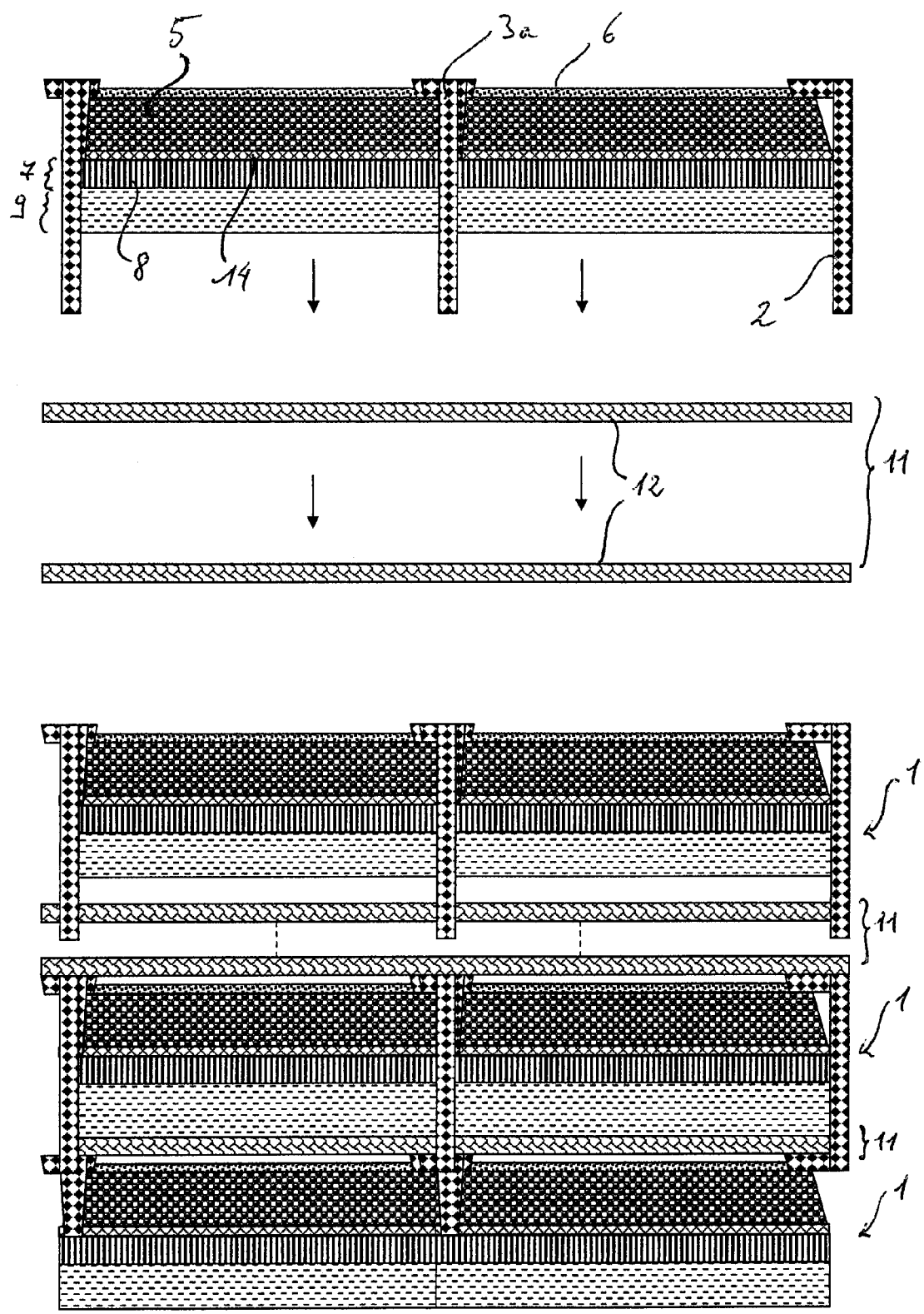
FIG. 4 is a schematic cross-sectional view along the depth of, and perpendicular to, the stack of FIG. 1.

On FIG. 4 is shown a cross-sectional view of the stack of wavelength selective absorption layers 1 of FIG. 1 across the length of the stripes building the grating 5. The metal contacts within each wavelength selective absorption layers 1 are interconnected between them on both sides of the stack by the 3d-metal interconnections 2. On FIG. 4 are clearly visible the different stripes 5 covered by the anti-reflective coating 6. Subjacent to gratings are shown the second active layer 7 with the depletion area 8 spread below almost the entire length of the stripes. The second active layer 7 is laying down the third electrically inactive layer 9 while between the different wavelengths selective absorption layers 1 are placed the electrically inactive distance layer 11 possibly of different width.

Figure 5:
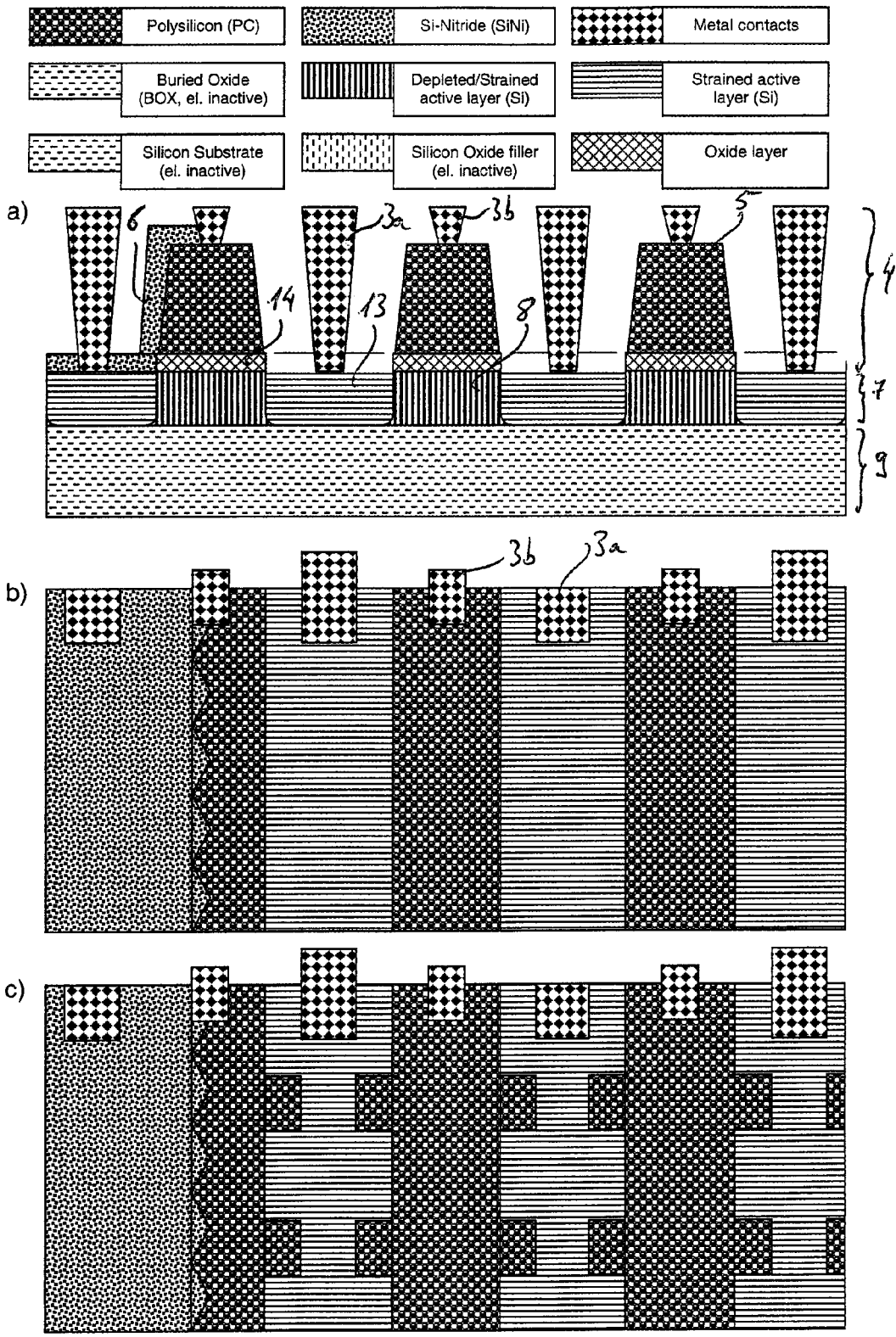
FIG. 5a is a cross-sectional view of the stack of FIG. 1.
FIGS. 5b, 5c are top views of the stack of FIG. 1.

On FIGS. 5b and 5c are shown a top view of the stack of wavelength selective absorption layer from FIG. 1. The 3d-metal interconnections 2 are removed at the left side to be able to assembly a maximum of stacks on a single integrated circuit (see cross sectional view FIG. 5a). On the right side of the stack are shown the different metal contacts 3 with the beginning of the 3d-metal interconnections 2. Also visible are the different parallel stripes building the grating 5 while the electrically inactive filling material 10 is removed to show in between the stripes the top of the second active layer 7. The Si-based technology is chosen for the example shown on FIGS. 5a to 5c. FIG. 5b is a one-dimensional grating example. And FIG. 5c is a two-dimensional grating example according to the invention and as used for the absorption curves on FIGS. 2a and 2b.

Figure 6:
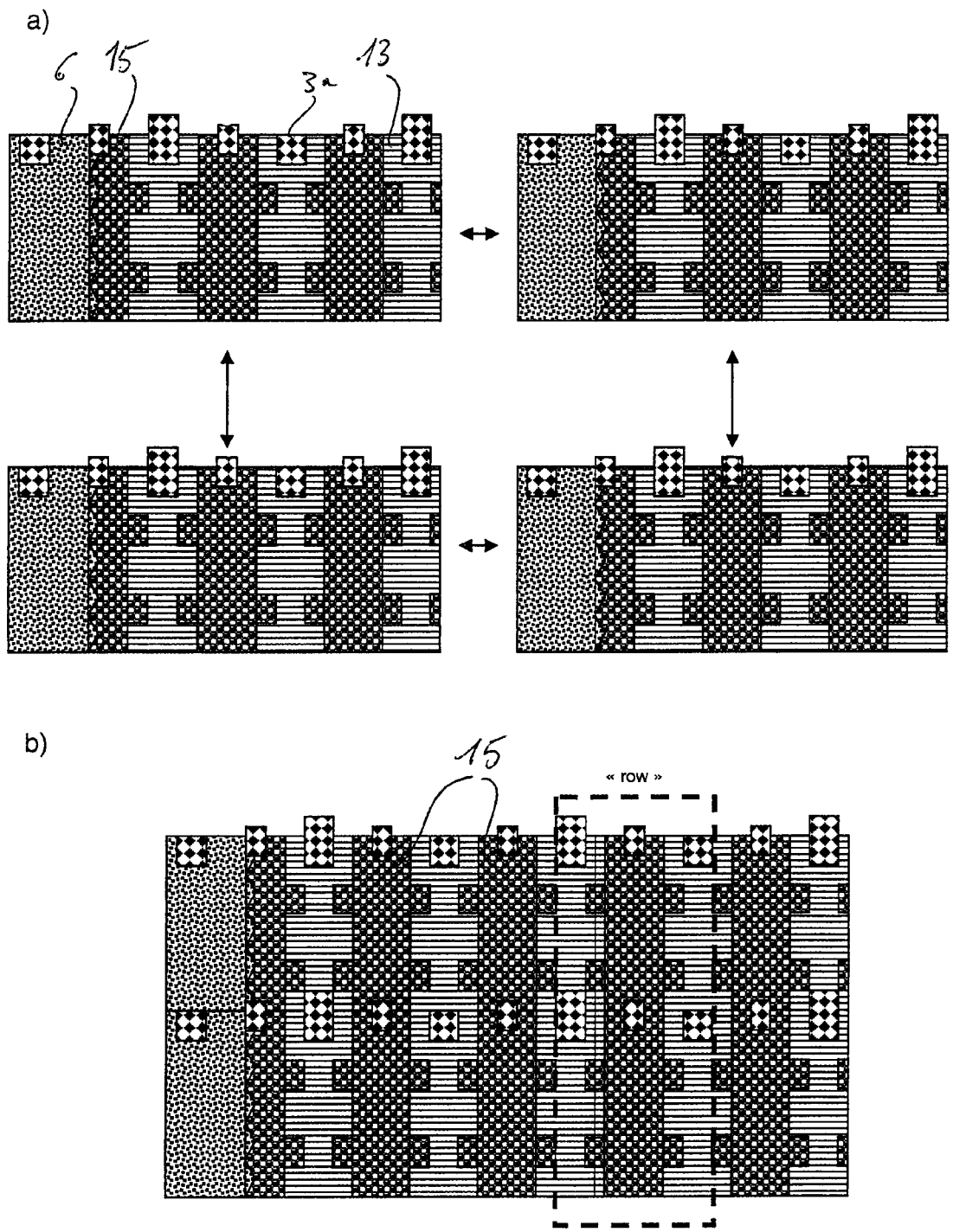
FIG. 6a is a schematic top view of four stacks from FIG. 1.
FIG. 6b is a schematic top view of the four stacks from FIG. 6a assembled according to the inventions.

FIGS. 6a to 6c show an alternative grating according to the invention made out of periodic poly-stripes 15 (two-dimensional gratins as shown on FIG. 5c). The average distance between the stripes is defined by parameter a and corresponds to the pitch of the grating. The poly-stripes 15 are also defined by a width which is varied along the length of the stripes periodically with a period b. The structure of poly-stripes is advantageously chosen when both the S and P polarizations of incident light shall be captured. Such poly-stripes 15 can be based on usual poly-silicon allowing using standard CMOS manufacturing process without implying process modifications. FIG. 6a shows a top view of several stacks from FIG. 5c with the poly-stripes 15 and the 3d-metal interconnection 2 to be assembled on an integrated circuit as shown on FIG. 6b.

Advantageously, strained silicon instead of bulk silicon can be chosen for the second active layer 7 within each wavelength selective absorption layer 1. The strained silicon layer provides greater mobility for the generated electrical carrier charges (electrons and holes). Photo-detectors build using such material provides high charge mobility and thus higher response and performance in comparison to a photo-detector device which uses bulk silicon for light absorption. The high charge mobility also translates into greater photo-current and higher responsivity of the photo-detector device. This is due to the fact that the tensile strain on the silicon reduces the band gap. Thus, light at still longer wavelengths can be absorbed by the second active layer 7 made out of strained silicon layer as can be absorbed by bulk silicon. Due to the number and location of the metal contacts and the interconnection of all the active regions after assembly, potential defects and bad processing of the metal interconnect causing a broken contact do not harm the design. One working contact per row (see FIG. 6b) would be sufficient to collect all generated charges by incident light within that row.

What is claimed is:

1. A multi-junction opto-electronic device comprising a stack of wavelength selective absorption layers, the absorption layers comprising each a first layer with a grating of a specific pitch defining wavelength of an incident light to be absorbed within a subjacent second electrically active layer which is on a third electrically inactive layer, the second electrically active layer of different absorption layers being in electrical connection with lateral contacts to extract electrical charge carriers generated by the absorbed incident light within the active layer, wherein the active layer within the absorption layers is defined by regions doped at variable concentrations such that regions underneath stripes of the grating corresponds to a first regions doped at a concentration at least an order of magnitude smaller than a concentration of a second regions in between the first regions, while the stripes of the first layer being electrically isolated from the first regions of the second electrically active layer.

2. The multi-junction opto-electronic device according to claim 1 wherein the grating within the first layer is defined by the stripes of periodic having specific width depending on the wavelength to be absorbed by the respective absorption layers, the period being defined by the pitch.

3. The multi-junction opto-electronic device according to claim 1 wherein dopants for the first region can be of p- or n-kind whereas being the same for the whole active layer and dopants for the second region are chosen to be alternately of p- and n-kind.

4. The multi-junction opto-electronic device according to claim 1 wherein the gratings within the first layer of the different absorption layers are respectively covered by an anti-reflective coating.

5. The multi-junction opto-electronic device according to claim 1 wherein the absorption layers are covered by an electrically inactive distance layer of a specific width adapted to a stationary wave generated in a perpendicular direction to a plane comprising the absorption layers and coming from a superposition of the incident light.

6. The multi-junction opto-electronic device according to claim 1 wherein within the first layer is deposited some electrically inactive filling material equalizing the first layer.

7. The multi-junction opto-electronic device according to claim 1 wherein it is based on silicon technology such that the third electrically inactive layers are made with some glass like material, the stripes are made with poly-silicon and the second electrically active layers are made of silicon accordingly doped.

8. The multi-junction opto-electronic device according to claim 1 wherein the grating within the first layer of the absorption layer is made with some material causing tensile strain on the second electrically active layer adjacent to the grating.

9. The multi-junction opto-electronic device according to claim 1 wherein the stripes are periodic poly-stripes and the grating is defined by the periodic poly-stripes with a period a equal to the pitch of the grating and a width varied periodically along their length with a period b, both period parameters a and b being adjusted to increase the absorption of both polarization S and P from the incident light.

* * * * *